(12) United States Patent
Scatchard et al.

(10) Patent No.: US 9,104,825 B1
(45) Date of Patent: Aug. 11, 2015

(54) METHOD OF REDUCING CURRENT LEAKAGE IN A PRODUCT VARIANT OF A SEMICONDUCTOR DEVICE

(71) Applicant: PMC-SIERRA US, INC., Sunnyvale, CA (US)

(72) Inventors: Bruce Scatchard, Anmore (CA); Chunfang Xie, Coquitlam (CA); Scott Barrick, Surrey (CA); Kenneth D. Wagner, West Vancouver (CA)

(73) Assignee: PMC-Sierra US, Inc., Sunnyvale, CA (US)

( * ) Notice: Subject to any disclaimer, the term of this patent is extended or adjusted under 35 U.S.C. 154(b) by 0 days.

(21) Appl. No.: 14/493,157

(22) Filed: Sep. 22, 2014

Related U.S. Application Data

(63) Continuation-in-part of application No. 13/535,835, filed on Jun. 28, 2012, now Pat. No. 8,843,870.

(51) Int. Cl.
| | |
|---|---|
| *H01L 21/82* | (2006.01) |
| *G06F 17/50* | (2006.01) |
| *H01L 21/265* | (2006.01) |
| *H01L 21/266* | (2006.01) |
| *H01L 21/28* | (2006.01) |

(52) U.S. Cl.
CPC ........ *G06F 17/5031* (2013.01); *G06F 17/5081* (2013.01); *H01L 21/265* (2013.01); *H01L 21/266* (2013.01); *H01L 21/28008* (2013.01)

(58) Field of Classification Search
CPC ................ H01L 21/265; H01L 21/266; H01L 21/28008; G06F 17/5031; G06F 17/5081

USPC ............................................ 438/14, 129, 130
See application file for complete search history.

(56) References Cited

U.S. PATENT DOCUMENTS

| | | | |
|---|---|---|---|
| 6,928,635 B2 * | 8/2005 | Pramanik et al. | ................ 716/53 |
| 7,441,211 B1 | 10/2008 | Gupta et al. | |
| 7,567,478 B2 * | 7/2009 | Brown | ........................... 365/227 |
| 2011/0156167 A1 | 6/2011 | Kornachuk | |

OTHER PUBLICATIONS

Fallah et al., Standby and Active Leakage Current Control and Minimization in CMOS VLSI Circuits, IEEE, 2004, pp. 1-21.

* cited by examiner

*Primary Examiner* — Victor A Mandala
(74) *Attorney, Agent, or Firm* — Dennis R. Haszko

(57) ABSTRACT

A method of reducing current leakage in product variants of a semiconductor device, during the fabrication of the semiconductor device. The method involves using a semiconductor process technique for reducing current leakage in semiconductor product variants having unused circuits. A semiconductor device or integrated circuit fabricated by this method has reduced current leakage upon powering as well as during operation. The method involves semiconductor process technique that substantially increases the $V_t$ (threshold voltage) of all transistors of a given type, such as all N-type transistors or all P-type transistors. The semiconductor process technique is also suitable for controlling other transistor parameters, such as transistor channel length, as well as other active elements, such as N-type resistors or P-type resistors, in unused circuits which affect leakage current as well as for unused circuits having previously applied semiconductor process techniques, such as a high $V_t$ circuit, a standard $V_t$ circuit, a low $V_t$ circuit, and an SRAM cell $V_t$ circuit.

21 Claims, 9 Drawing Sheets

| Devices | Mask | Low VT | | Std VT | | High VT | | SRAM Cell | | |
|---|---|---|---|---|---|---|---|---|---|---|
| | | NMOS | PMOS | NMOS | PMOS | NMOS | PMOS | PD | PG | PU |
| HVT-N | 1-N | 0 | 0 | 0 | 0 | 1 | 0 | 1 | 1 | 0 |
| LVT-N | 2-N | 0 | 0 | 1 | 0 | 1 | 0 | 0 | 0 | 0 |
| SVT_N | 3-N | 1 | 0 | 1 | 0 | 1 | 0 | 0 | 0 | 0 |
| N-Cell | 4-N | 0 | 0 | 0 | 0 | 0 | 0 | 1 | 1 | 0 |
| Addition NMOS | PMC_N | 1 | 0 | 0 | 0 | 1 | 1 | 1 | 1 | 0 |
| HVT-P | 1-P | 0 | 0 | 0 | 1 | 0 | 1 | 0 | 0 | 0 |
| LVT-P | 2-P | 0 | 1 | 0 | 1 | 0 | 1 | 0 | 0 | 0 |
| SVT_P | 3-P | 0 | 0 | 0 | 1 | 0 | 1 | 0 | 0 | 1 |
| P-Cell | 4-P | 0 | 1 | 0 | 0 | 0 | 0 | 0 | 0 | 1 |
| Addition PMOS | PMC_P | 0 | 1 | 0 | 1 | 0 | 1 | 0 | 0 | 1 |

Note: "1" refers to mask open, with IMP dosage

FIG. 2

| NMOS | | Vt increase ratio | PMOS | | Vt increase ratio | Ioff reduction ratio at Thermal |
|---|---|---|---|---|---|---|
| UHVtn1 | Vtl | 1.340 | UHVtp1 | Vtl | 1.200 | 0.11 |
| UHVtn2 | Vtl | 1.170 | UHVtp2 | Vtl | 1.100 | |
| UHVtn3 | Vtl | 1.340 | UHVtp3 | Vtl | 1.200 | 0.33 |
| Hvt NMOS | Vtl | 1.350 | Hvt PMOS | Vtl | 1.221 | 1.00 |
| SVt NMOS | Vtl | 1.339 | Svt PMOS | Vtl | 1.171 | 3 |
| LVt NMOS | Vtl | 1.000 | Lvt PMOS | Vtl | 1.000 | 9 |
| Notes: | Ioff reduction ratio is repect to Hvt transistors. | | | | | |

| Devices | Mask | Low VT | | Std VT | | High VT | | SRAM Cell | | | Resistor | |
|---|---|---|---|---|---|---|---|---|---|---|---|---|
| | | NMOS | PMOS | NMOS | PMOS | NMOS | PMOS | PD | PG | PU | N-type | P-type |
| HVT-N | 1-N | 0 | 0 | 0 | 0 | 1 | 0 | 1 | 1 | 0 | 0 | 0 |
| LVT-N | 2-N | 1 | 0 | 1 | 0 | 1 | 0 | 0 | 1 | 0 | 0 | 0 |
| SVT_N | 3-N | 1 | 0 | 1 | 0 | 1 | 0 | 0 | 0 | 0 | 0 | 0 |
| N-Resistor block | R-N | 0 | 0 | 0 | 0 | 0 | 0 | 0 | 0 | 0 | 1 | 0 |
| N-Cell | 4-N | 0 | 0 | 0 | 0 | 0 | 0 | 1 | 1 | 0 | 1 | 0 |
| Addition NMOS | PMC_N | 1 | 0 | 1 | 0 | 1 | 0 | 0 | 0 | 0 | 0 | 0 |
| HVT-P | 1-P | 0 | 0 | 0 | 0 | 0 | 1 | 0 | 0 | 1 | 0 | 0 |
| LVT-P | 2-P | 0 | 0 | 0 | 1 | 0 | 1 | 0 | 0 | 0 | 0 | 0 |
| SVT_P | 3-P | 0 | 1 | 0 | 1 | 0 | 1 | 0 | 0 | 0 | 0 | 0 |
| P-Resistor block | R-P | 0 | 0 | 0 | 0 | 0 | 0 | 0 | 0 | 1 | 0 | 1 |
| P-Cell | 4-P | 0 | 0 | 0 | 0 | 0 | 0 | 0 | 0 | 1 | 0 | 1 |
| Addition PMOS | PMC_P | 0 | 1 | 0 | 1 | 0 | 1 | 0 | 0 | 0 | 0 | 1 |

Note: "1" refers to mask open, with IMP dosage or block the salicidation

FIG. 4

METHOD OF REDUCING CURRENT LEAKAGE IN A PRODUCT VARIANT OF A SEMICONDUCTOR DEVICE

CROSS REFERENCE TO RELATED APPLICATIONS

This application is a continuation-in-part of U.S. patent application Ser. No. 13/535,835 filed on Jun. 28, 2012, now U.S. Pat. No. 8,843,870, which is hereby incorporated by reference.

FIELD

This disclosure relates to semiconductor devices and integrated circuit (ICs). Specifically, this disclosure relates to reducing current leakage in semiconductor devices and ICs.

BACKGROUND

Current related art techniques for power leakage reduction include multiple voltage threshold (multi-$V_t$) bias techniques. Such techniques are generally applied during the design process.

In order to save design cost and time to market, semiconductor designers typically use only one platform design to satisfy the feature and performance requirements of many related product applications; in this way, the cost of product development is amortized over many design opportunities. However, this related art approach for accommodating any given customer's intended use or product application results in unwanted power consumption in idle circuits, because the current leakage is a significant part of the total power dissipation.

It is desirable to provide a power leakage reduction technique that addresses the problem of power reduction for a plurality of product variants of a semiconductor device or IC after the device has been designed.

BRIEF DESCRIPTION OF THE DRAWINGS

For a better understanding of the present disclosure, reference is made to the below-referenced accompanying drawings. Reference numbers refer to the same or equivalent parts of the present disclosure throughout the several figures of the drawings.

FIG. 2 is a table, showing a mask "truth" table for fabricating an approximately 40-nm semiconductor device, by example only, according to an embodiment of the present disclosure.

FIG. 4 is a table, showing a mask truth table for fabricating a product variant of a semiconductor device having other elements, by example only, according to an embodiment of the present disclosure.

DETAILED DESCRIPTION

Figure 1:
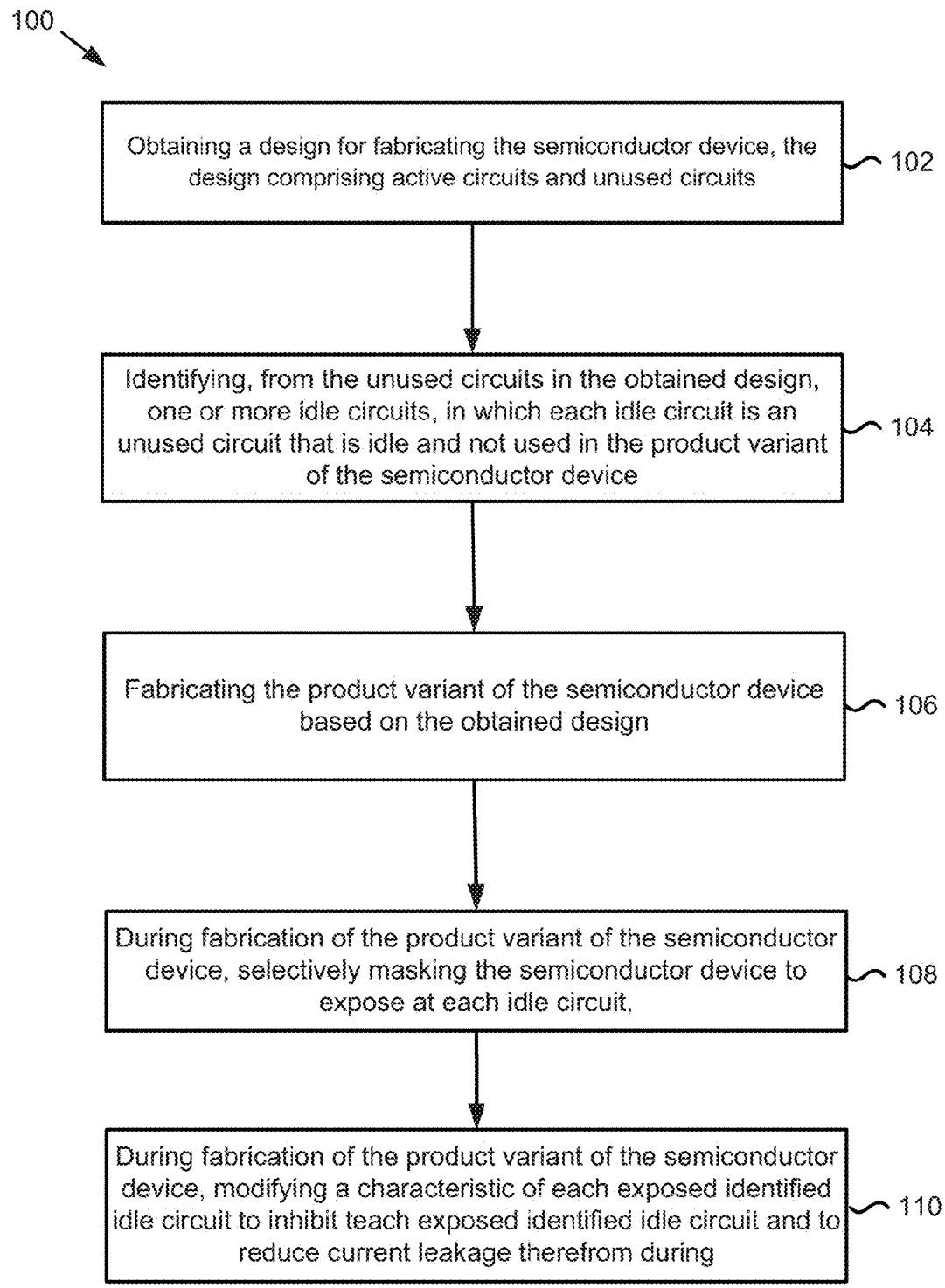
FIG. 1 is a flowchart, showing a method of reducing current leakage in at least one idle circuit of a product variant of a semiconductor device, by example only, according to the present disclosure.

The present disclosure describes some solutions to the problem of power reduction for a plurality of product variants of a semiconductor device after the semiconductor device has already been designed. For example, this disclosure relates to a method for reducing current leakage in product variants of a semiconductor device, during the fabrication of the semiconductor device. In an embodiment, the present disclosure provides a method of reducing current leakage during wafer processing using various techniques and a device thereby formed.

In an embodiment, the present disclosure provides a method of reducing current leakage in a product variant of a semiconductor device that includes: obtaining a design for fabricating the semiconductor device, in which the design includes active circuits and unused circuits; identifying, from the unused circuits in the obtained design, using, for example, a processor, one or more idle circuits, where each idle circuit is an unused circuit that is idle and not used in the product variant; fabricating the product variant based on the obtained design; and during fabrication of the of the product variant of the semiconductor device: selectively masking the product variant of the semiconductor device to expose each identified idle circuit; and modifying a characteristic of each exposed identified idle circuit to inhibit each exposed identified idle circuit and to reduce current leakage therefrom. Advantageously, a product variant of a semiconductor device fabricated by the method of the present disclosure has reduced current leakage upon powering and during operation.

In an embodiment, the unused circuits in the obtained design are identified, using design analysis on the product variant of the semiconductor device. In another embodiment, the unused circuits in the obtained design are identified using function simulation on the product variant of the semiconductor device. In another embodiment, the unused circuits in the obtained design are identified, using hardware emulation on the product variant of the semiconductor device.

In another embodiment, the unused circuits in the obtained design are identified by applying subtractive idle circuit identification. In another embodiment, applying subtractive idle circuit identification includes performing a static timing analysis on the active circuits and the unused circuits in the obtained design by using a predetermined set of timing constraints for the product variant of the semiconductor device.

In another embodiment, the unused circuits in the obtained design are identified by: analyzing static timing of all active circuits defined by the product variant of the semiconductor to generate a timing-constrained circuit list including one or more timing-constrained active circuits that have a timing-constrained path; generating a non-timing constrained circuit list including one or more non-timing-constrained active circuits by omitting the one or more active circuits that have a timing constrained path from a list of all active and unused circuits in the obtained design. In another embodiment, identifying, in the second circuit list, the plurality of idle circuits by omitting, from the second circuit list, circuits remaining in operation in the product variant of the semiconductor device.

In another embodiment, the method further includes applying a scan-based test to the fabricated product variant, wherein the scan-based test is the same scan-based test applied to the semiconductor device. Thus, the scan-base test applied to the semiconductor device can be applied to the fabricated product variant without modification.

In another embodiment, analyzing static timing of all active circuits includes analyzing static timing of all circuits defined by the product variant of the semiconductor device by using a set of timing constraints for the product variant, thereby providing static timing circuit data including data relating to each of the one or more timing-constrained active circuits.

In another embodiment, the method of the present disclosure includes reanalyzing static timing of all active circuits, and performing, utilizing a processor, at least one of a circuit level simulation and a gate level timing simulation for confirming that the fabricated product variant of the semiconductor device is fully functional.

In another embodiment, identifying, from the unused circuits in the obtained design, using, for example, a processor, one or more idle circuits, includes applying a marker layer for tagging the one or more idle circuits.

In another embodiment, the method of the present disclosure includes selecting an exception circuit from the one or more idle circuits, and maintaining power to the exception circuit, providing the exception circuit with a minimized current leakage, and rendering the exception circuit operable at a minimized speed.

In another embodiment, the method of the present disclosure identifies a plurality of idle circuits and selectively masking the product variant of the semiconductor device comprises masking the plurality of idle circuits of the same device type with an idle circuit mask distinctive to the device type.

In another embodiment, the plurality of idle circuits include a first set of idle circuits of a first device type and a second set of idle circuits of a second device type, and selectively masking includes masking the first set of idle circuits with a first idle circuit mask, masking the second set of idle circuits with a second idle circuit mask, and the first and second idle circuit masks are distinctive to the first and second device type, respectively.

In another embodiment, modifying a characteristic of each exposed identified idle circuit includes modifying an electrical characteristic of each exposed idle circuit, resulting in the each exposed idle circuit having modified electrical properties.

In another embodiment, modifying a characteristic of each exposed identified idle circuit includes modifying a physical characteristic of each exposed idle circuit, resulting in the each exposed idle circuit having modified electrical properties.

In another embodiment, modifying a characteristic of each exposed identified idle circuit includes implanting a dopant.

In another embodiment, modifying a characteristic of each exposed identified idle circuit includes modifying a gate dielectric thickness or modifying a gate length. In another embodiment, modifying a gate length comprises a modifying a poly critical dimension (CD), modifying a gate spacer dimension, or modifying a FinFET fin width.

In another embodiment, modifying a characteristic of each exposed identified idle circuit includes substantially increasing the $V_t$ (threshold voltage) of all transistors of a given type, such as all N-type transistors or all P-type transistors. In an alternative embodiment, modifying a characteristic of each exposed identified idle circuit includes modifying other transistor parameters, such as transistor channel length, as well as other active elements, such as N-type resistors or P-type resistors, in unused circuits which affect leakage current as well as for unused circuits having previously applied semiconductor process techniques, such as a high $V_t$ circuit, a standard $V_t$ circuit, a low $V_t$ circuit, and an SRAM cell $V_t$ circuit.

In wafer processing, product variants of a semiconductor device tend to share the same die; however, some functional blocks are not required to be active in some product variants of the semiconductor device. In order to save cost and time to market, chip foundries desire to use the same design, e.g., the same mask set, for fabricating all product variants of a semiconductor device. Power consumption associated with unused functional blocks, also known as idle circuits, is a concern in that, while still being powered, these unused functional blocks dissipate static power in the form of current leakage. In the present disclosure, an idle circuit is an unused circuit that is not only idle, but also not intended to be used at all in a given product variant, such that it can be shut down or disabled without consequence. For example, an idle circuit is identified as not necessary for correct functional operation of a product variant.

According to embodiments of the present disclosure, significantly reducing the current leakage of these unused functional blocks (e.g. idle circuits) can provide a competitive market advantage for all product variants of a semiconductor device that share the same die. For example, the present disclosure describes a method of reducing current, which determines power, on some of the non-used paths of the product variant of the semiconductor device. Optionally, the method of the present disclosure includes increasing the capacitance or the resistance of specific circuit elements in the product variant of the semiconductor device, such as increasing varactor capacitance or increasing resistor values.

A method according to an embodiment of the present disclosure reduces design cost and time to market for new product variants of a semiconductor device by efficiently generating one or more product variants of the semiconductor device and reducing or eliminating the need for expensive approaches relating to area and timing, such as power-gating, in an attempt to reduce static power dissipation. Product variants of a semiconductor devices formed by a method of the present disclosure have significantly reduced current leakage.

Features of the present disclosure include, but are not limited to, a significant reduction of the thermal current leakage. In an example embodiment, thermal leakage current reduction is in a range of approximately 80% to approximately 90% in the idle circuits. Such significant thermal current leakage reduction is especially useful for product variants of a semiconductor device, wherein large blocks of logic are unused. Embodiments of the present disclosure reduce and preferably eliminate a need for any major product design changes, since the method and device involve only a marker layer for tagging the one or more identified idle circuits. Embodiments of the present disclosure allow slow continued operation of the affected circuits, without compromising the design for test (DFT).

Embodiments of the present disclosure also provide one or more of the following: inhibits floating node generation, since the method and product variant of the semiconductor device do not generate undriven outputs; minimizes mask costs; and increases efficiency in current leakage reduction for an existing semiconductor device design, by using one platform configuration that is applicable for a plurality of product variants of the semiconductor device. Embodiments described herein also provide amortization of development costs over many product variants of a semiconductor device, decrease overall power consumption of the product variants of the semiconductor device, and address adverse effects of unused functional blocks and unused circuits from customer to customer.

The disclosed method also applies to ICs, such as chips with a field-programmable gate array (FPGA), as well as to all types of transistors in a single functional circuit block, such as ultra-high threshold voltage (UHVT) devices, high threshold voltage (HVT) devices, low threshold voltage (LVT) devices, ultra-low threshold voltage (ULVT) devices, standard threshold voltage (SVT) devices, static random access memory (SRAM) devices, and cell VT devices. Further, the method is compatible use with poly-masking or poly-resistor masking for providing the highest channel bias, IC devices formed by the disclosed method experience increased power savings without impacting overall product performance. Even further, the disclosed method preserves testability of a semiconductor device by allowing use of the same vectors.

FIG. 1 is a flowchart illustrating a method 100 of reducing current leakage in a product variant of a semiconductor device in accordance with an embodiment of the present disclosure. The method 100 begins at 102 by obtaining a design for fabricating the semiconductor device. The design includes active circuits and unused circuits. The method then proceeds to 104. At 104, one or more idle circuits are identified from the unused circuits in the obtained design. Each identified idle circuit is an unused circuit that is idle and not used in the product variant of the semiconductor device. The method then proceeds to 106. At 106, the product variant of the semiconductor device is fabricated based on the obtained design. The method then proceeds to 108 where the method, during fabrication of the product variant of the semiconductor device, selectively masks the product variant of the semiconductor device to expose each identified idle circuit. The method then proceeds to 110 where the method, again during fabrication of the product variant of the semiconductor device, modifies a characteristic of each exposed identified idle circuit to inhibit each exposed identified idle circuit and to reduce current leakage therefrom.

In an embodiment, the method, at 104, identifies, from the unused circuits in the obtained design, one or more idle circuits using design analysis on the product variant of the semiconductor device.

In another embodiment, at 104, the method identifies, from the unused circuits in the obtained design, one or more idle circuits using function simulation on the product variant of the semiconductor device.

In another embodiment, at 104, the method identifies, from the unused circuits in the obtained design, one or more idle circuits using hardware emulation on the product variant of the semiconductor device.

In another embodiment, the method identifies at 104 a plurality of idle circuits that each has the same device type, such as P-type or N-type. In this example embodiment, selectively masking the semiconductor device during fabrication of the product variant of the semiconductor device at 108 comprises masking the plurality of idle circuits of the same device type with an idle circuit mask distinctive to the device type.

Optionally, selectively masking the device to expose each of the identified idle circuits during fabrication of the product variant of the semiconductor device at 108 can include using a mask that is distinctive in relation to one, or each, device-type within a given identified idle circuit, e.g., an N-MOS device and a P-MOS device. Since both N-type and P-type devices may occur in a given circuit, both types of corresponding masking may be used in the disclosed method. For example, poly-resistors are adjustable and may be used for selective masking. Where applicable in other embodiments, a single mask type can also be used for reducing fabrication costs. The disclosed selective masking may be used for both digital and analog devices.

In another example embodiment, the one or more idle circuits include a first set of idle circuits of a first device type and a second set of idle circuits of a second device type. In this example embodiment, selectively masking the semiconductor device to expose at each idle circuit during fabrication of the product variant at 108 includes: masking the first set of idle circuits with a first idle circuit mask; and masking the second set of idle circuits with a second idle circuit mask, the first and second idle circuit masks being distinctive to the first and second device type, respectively.

In an example embodiment, selectively masking the semiconductor device to expose at each idle circuit during fabrication of the product variant during fabrication of the product variant at 108 includes selectively masking a plurality of analog circuits, a plurality of digital circuits, or both.

In an embodiment, modifying the characteristic of each exposed identified idle circuit during fabrication of the product variant at 110 includes modifying an electrical characteristic or a physical characteristic, or both, of the circuit, resulting in the at least one identified idle circuit having modified electrical properties. Modifying the characteristic of the circuit can comprise applying a semiconductor process technique to the circuit.

In an example embodiment, modifying the characteristic of each exposed idle circuit during fabrication of the product variant at 110 includes implanting a dopant. In an example embodiment, implanting the dopant comprises implanting at least one custom dopant, for example at least one of: a voltage threshold ($V_t$) implant, a pocket implant, a lightly doped drain (LDD) implant, and a source and drain implant. In each of these examples, modifying can comprise increasing the characteristic.

In an example embodiment, modifying the characteristic of teach exposed idle circuit during fabrication of the product variant at 110 includes at least one of: modifying a gate dielectric thickness and modifying a gate length. Modifying a gate length includes at least one of modifying a poly critical dimension (CD), modifying a gate spacer dimension, and modifying a FinFET fin width.

In an example embodiment, identifying at 102 includes identifying the one or more idle circuits based on a set of timing constraints corresponding to for the product variant of the semiconductor device.

In another example embodiment, identifying at 102 includes applying a subtractive idle circuit identification. In an example embodiment, the subtractive idle circuit identification includes listing all circuits, such as gates, in a product netlist, by using available data which, for example, is extractable from a database or a spreadsheet and analyzing static timing (performing static timing analysis "STA") of all circuits by using a given set of timing constraints for the product variant of the semiconductor device.

STA is an exhaustive process used in the disclosed method for ensuring that the performance requirements of synchronous digital circuits in the semiconductor device and the product variant of the semiconductor device are met under all manufacturing conditions. STA can be implemented by way of CAD tools, by example only, and use information regarding the existence of timing models relating to the circuit types that are integrated into a given product. For instance, the timing models can specify the interconnect delay, the slew, and other characteristics of each circuit type. By combining these timing models with information regarding the interconnect delays, an STA tool, such as a CAD tool, can evaluate the fastest paths and the slowest paths in a device. Timing constraint information that is input to the STA tool is compared with this interconnect delay information to ensure that all product performance goals are satisfied, without exception.

In an example embodiment, identifying at 102 includes: analyzing static timing of all circuits defined by the product variant for determining a first circuit list including at least one timing-constrained circuit having a timing-constrained path; generating a second circuit list of at least one non-timing-constrained circuit by omitting circuits in the first circuit list from a list of all circuits; and identifying, in the second circuit list, the one or more idle circuits in the product variant of the semiconductor device by omitting, from the second circuit list, circuits for remaining in operation in the product variant. The timing-constrained paths can be specified in Synopsys Design Constraint (SDC) format. The one or more idle circuits are identified as not necessary for correct functional operation of the product variant of the semiconductor device, and identified from the second list after those circuits that should remain in operation have been omitted.

In an example embodiment, analyzing can include applying a scan-based test to the fabricated product variant. The scan-based test can be the same scan-based test that was applied to the semiconductor device so that the scan-based test can be applied without modification. In another example embodiment, analyzing includes analyzing static timing of all circuits defined by the product variant of the semiconductor device by using a set of timing constraints for the product variant of the semiconductor device, thereby providing static timing circuit data including data relating to the at least one timing-constrained circuit.

In an example embodiment, the method further comprises: reanalyzing static timing of all circuits; and performing at least one of a circuit level simulation and a gate level timing simulation for confirming that the product variant that is fabricated is fully functional. The method can also further include reanalyzing the static timing of all the remaining non-idle circuits, rerunning "sign-off" STA, and performing any necessary circuit level or gate level timing simulation to ensure that the product variant of the semiconductor device is fully functional.

Testing the product circuits can involve scanning the circuits with a slow-speed scan, a DC test technique, such as a DC scan and/or a DC random access memory built-in self-test (RAM BIST). All automatic test pattern generation (ATPG) vectors, resulting from use of these slow-speed scan techniques, should continue to function properly on the product variant of the semiconductor device after the method has been applied. Testing the timing of all the circuits optionally involves scanning the circuits with a path timing, an AC test technique such an AC scan and/or at-speed RAM BIST. Eliminating parts based on testing of any idle circuits on the product variant of the semiconductor device poses a risk of yield loss or parts failure and would not further adversely affect operation of the product variant of the semiconductor device.

In an example embodiment, identifying at 102 includes applying a marker layer for tagging the one or more identified idle circuits.

In an example embodiment, the method 100 further comprises verifying the product variant configuration, including preparing a new set of timing models for all types of circuits that are identified as idle circuits. The method 100 may also include providing timing models for the idle circuits that are setting very large propagation and transition delays in the cells to ensure that they would fail static timing if found on a functional (timing-constrained) path during static timing. The timing models can be in Liberty format, such format being compatible with, or identical to, the corresponding reference timing models.

In some cases, certain circuits should or must remain operational, such as clock tree gates. These circuits that are desired to remain operational can be described as exception circuits. In another example embodiment, the method 100 further comprises: selecting an exception circuit from the one or more identified idle circuits; and maintaining power to the exception circuit, providing the exception circuit with a minimized current leakage, and rendering the exception circuit operable at a minimized speed. For example, an exception circuit is an initially selected identified idle circuit that is deemed to be excluded from the initially selected identified idle circuits for any other reason or criterion hitherto unaccounted in the initial selection.

According to other embodiments, the present disclosure provides a non-transitory computer-readable medium for storing statements and instructions, executable by a processor, and adapted to perform a method of reducing current leakage in a product variant of a semiconductor device, according to the various embodiments as described in detail above and herein.

Referring to FIG. 2, this table 110 illustrates a detailed example of transistor leakage and threshold voltage estimations using the method 100, according to another embodiment of the present disclosure. In this example, a production control unit can order a new product variant of a semiconductor device, having identical processes and masks 112 as those of the original product variant of the semiconductor device, with the addition of modified implant process masks 114 and 116. In the example embodiment of FIG. 2, first and second masks 114 and 116, identified as PMC-N and PMC-P implants, are added to inhibit the N-type and P-type idle circuits, respectively.

Figure 3:
FIG. 3 is a table, showing data for estimating transistor leakage and threshold voltages, by example only, according to an embodiment of the present disclosure.

Referring to FIG. 3, this table 120 illustrates a detailed example of leakage reduction estimations using the method 100, using an ultra-high threshold voltage (UHVt) target, according to an embodiment of the present disclosure. By example only, a custom implant $V_t$ target for a 40-nm structure can be twice (2×) that of HVt, wherein the estimated leakage will be reduced to less than one ninth (⅑). In this example, an SRAM element or device can also be selected as an idle circuit if needed.

Referring to FIG. 4, this table 130 illustrates a detailed example of using a mask logic operation using the method 100 to generate a new or custom implant mask, according to another embodiment of the present disclosure. While the foregoing examples have involved the use of transistors, instead, using the same general approach of method 100 with a varactor, a resistor value, and varactor gate leakages is also within the scope of the present disclosure. Use of the presently disclosed method 100 for varactors, resistor values, and de-capacitance of a capacitor's gate leakage is also beneficial for other product variants of the semiconductor device.

With respect to an example embodiment in relation to FIG. 4, the present method 100 also includes or encompasses replacing a varactor with a "de-cap" capacitor value, replacing a diffusion or a poly resistor value with a fabrication technique defining new values, and reducing varactor gate leakages. In an example embodiment, these steps are all performed while creating a custom implant to increase transistor threshold voltage. By using the present method 100 in conjunction with varactors, resistors, and other possible elements, the reduction of gate leakage or overall path current is enhanced with only some minor modifications in mask generation.

For example, in relation to FIG. 4, two additional masks, e.g., of one technology, are generated. The first mask 114 may be designated as a PMC-N mask for use with all NMOS and N-type elements, e.g., respectively, NMOS (HVt, LVt, SVt, SRAM, cell PD, PG) and N-type elements (NMOS varactor, N-type resistors). The second mask 116 may be designated as a PMC-P mask for use with all PMOS and P-type elements, e.g., respectively, PMOS (HVt, LVt, SVt, SRAM cell PU) and P-type elements (PMOS de-cap capacitor, P-type resistors).

FIGS. 5 to 9 are block diagrams logically illustrating a product variant of a semiconductor device at various stages of a semiconductor fabrication process, according to an embodiment of the present disclosure. One of ordinary skill in the art will appreciate that these are logical block diagrams used to illustrate device changes resulting from performing acts in a method according to embodiments of the present disclosure, and that other acts or steps are performed before and after those illustrated, as part of the semiconductor fabrication process.

Figure 5:
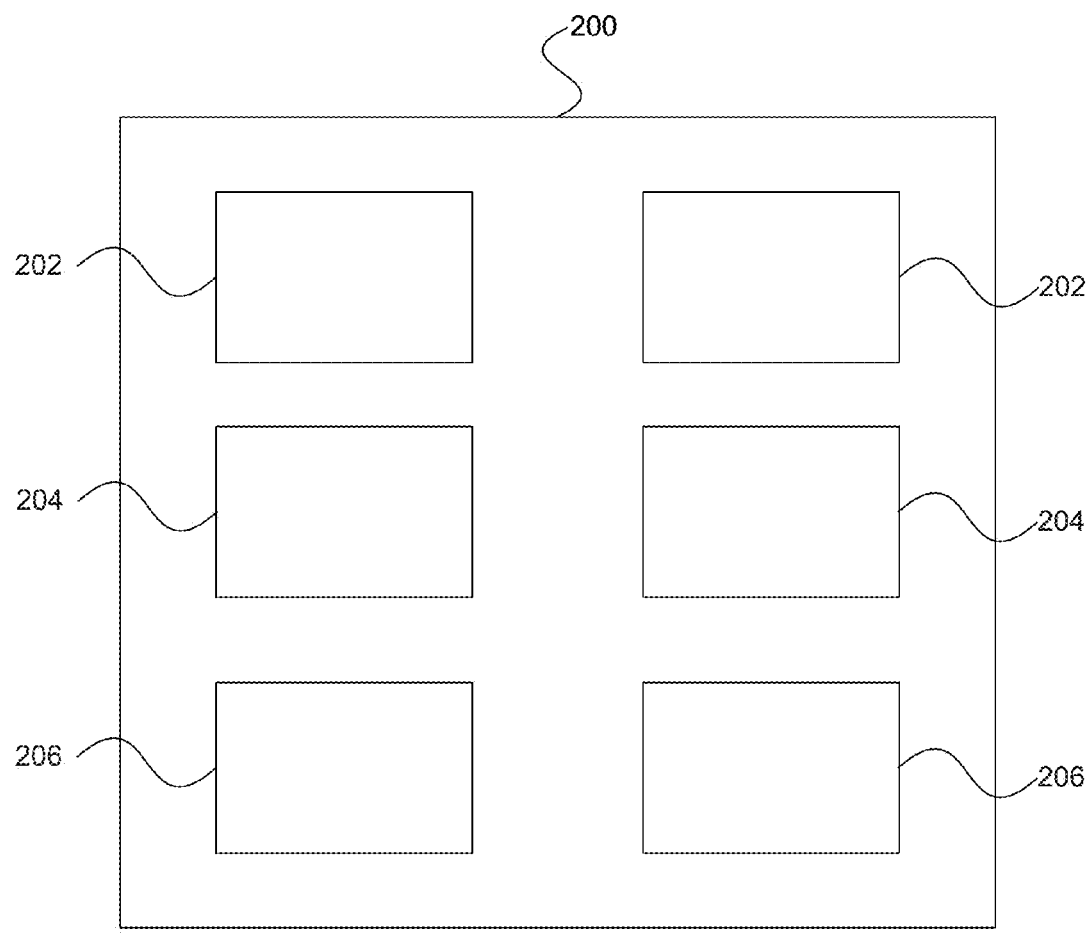
FIGS. 5 to 9 are block diagrams logically illustrating a product variant of a semiconductor device at various stages of a semiconductor fabrication process, according to an embodiment of the present disclosure.

As shown in the example embodiment of FIG. 5, a product variant 200 of a semiconductor device comprises a plurality of active circuits 202. The product variant 200 of the semiconductor device also comprises a first plurality of idle circuits 204 of a first type, such as N-type, and a second plurality of idle circuits 206 of a second type, such as P-type. The method 100 identifies that the circuits 204 and 206 are idle in the product variant of the semiconductor device 200 in step 104. FIG. 5 illustrates the product variant of the semiconductor device 200 before the steps 108 and 110 from the method 100 of FIG. 1 are performed. Steps 102, 104, and 106 have been performed at this stage in order to identify the idle circuits 204 and 206 in the obtained design of the semiconductor device.

Figure 6:
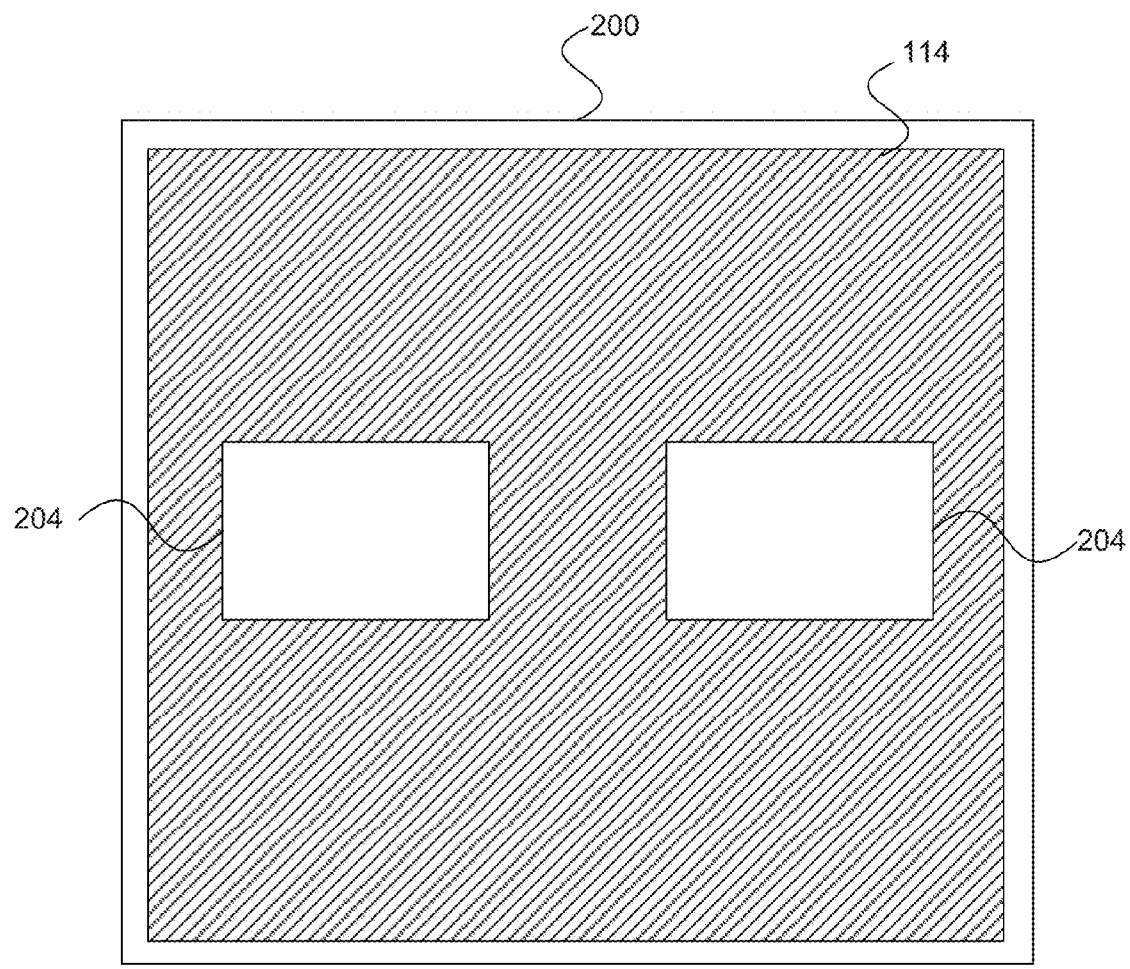

In FIG. 6, step 108 of FIG. 2 is applied such that the product variant 200 of the semiconductor device is selectively masked to expose at the identified idle circuits 204, 206. In the example embodiment of FIG. 6, a first idle circuit mask 114 is applied to the product variant 200 to expose the first plurality of idle circuits 204 of the first type. After the first mask 114 is applied, as shown in FIG. 6, step 110 is performed such that a characteristic of the first plurality of idle circuits 204 is modified, to inhibit the first plurality of idle circuits and reduce current leakage therefrom.

Figure 7:
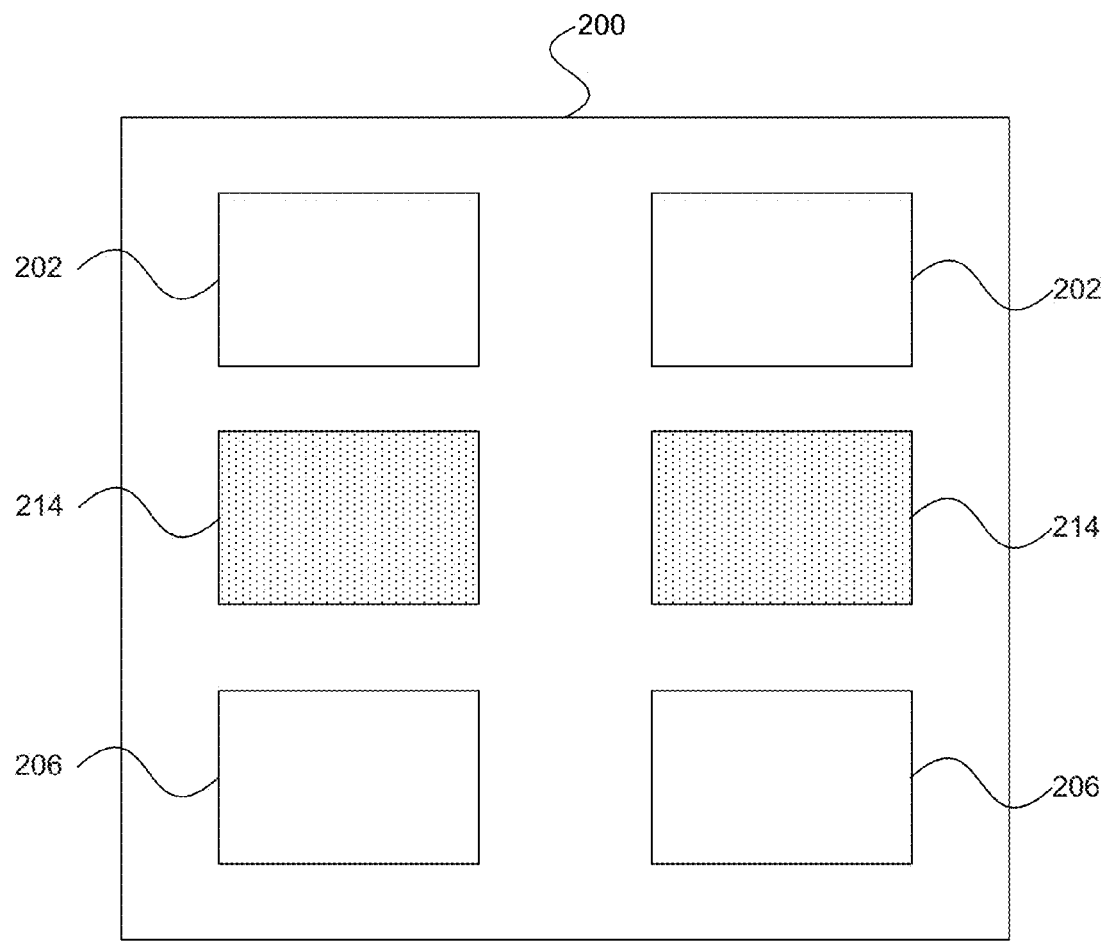

FIG. 7 illustrates the results, or effects, on the product variant 200 of step 110 having been performed. The first plurality of idle circuits 204 have been modified to produce a first plurality of inhibited circuits 214, as shown in FIG. 7.

Figure 8:
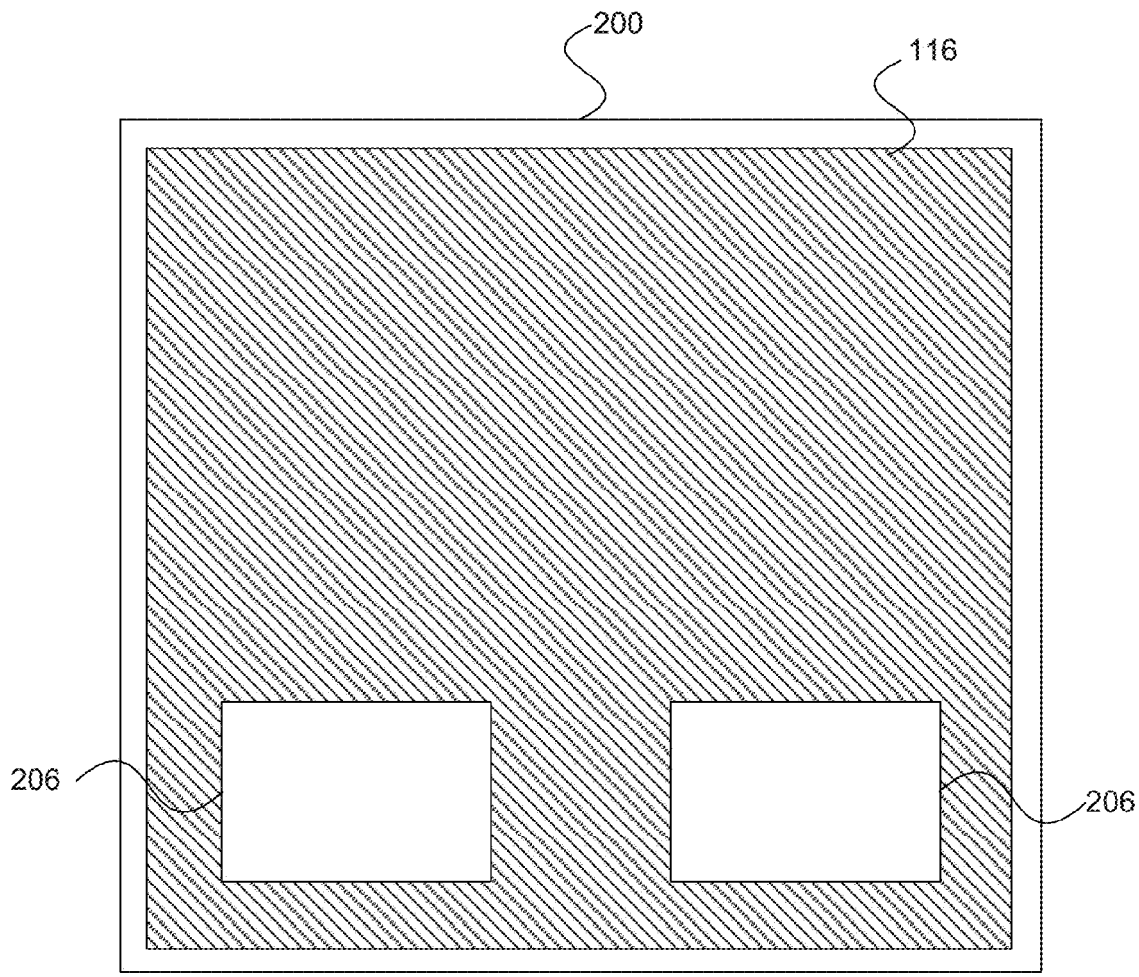
Figure 9:
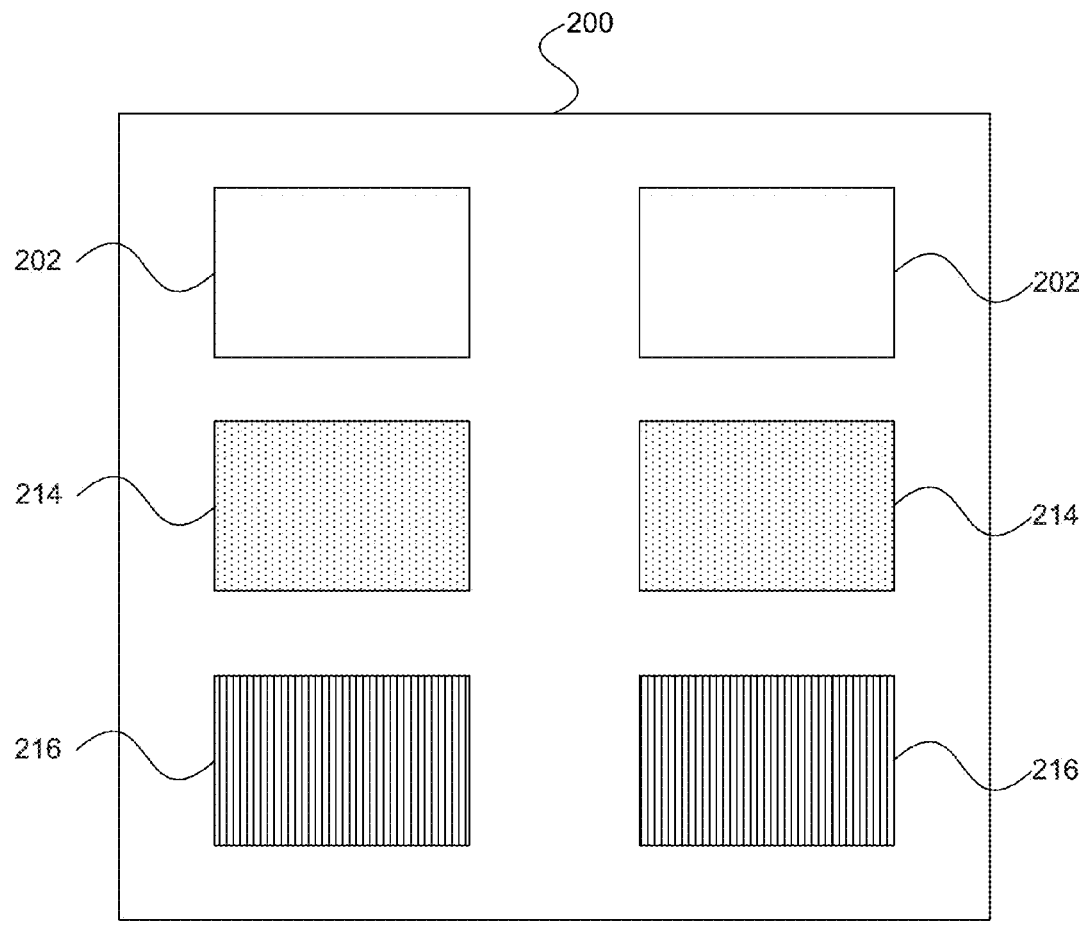

FIG. 8 and FIG. 9 further illustrate an example embodiment in which a second mask is applied. In FIG. 8, step 108 of FIG. 2 is applied a second time such that a second idle circuit mask 116 is applied to the product variant 200 to expose the second plurality of idle circuits 206 of the second type. After the second mask 116 is applied, as shown in FIG. 8, step 110 is again performed such that a characteristic of the second plurality of idle circuits 206 is modified, to inhibit the second plurality of idle circuits and reduce current leakage therefrom.

FIG. 9 illustrates the results, or effects, on the product variant 200 of step 110 having been performed on both the first and second plurality of idle circuits. The second plurality of idle circuits 206 have been modified to produce a second plurality of inhibited circuits 216, in addition to the first plurality of inhibited circuits 214.

Accordingly, in an embodiment, the present disclosure provides a product variant 200 of a semiconductor device, comprising: at least one active circuit; and one or more inhibited circuits having reduced current leakage, the one or more inhibited circuits having been identified as idle with respect to the semiconductor device and having undergone modification of a circuit characteristic during fabrication to generate one or more inhibited circuits from the one or more identified idle circuits.

In an example embodiment, the one or more inhibited circuits comprise first and second pluralities of inhibited circuits having reduced current leakage. The first plurality of inhibited circuits is of a first type and was identified as idle with respect to the semiconductor device and underwent modification of a circuit characteristic during fabrication to generate the first plurality of inhibited circuits from one or more identified idle circuits of the first type. The second plurality of inhibited circuits is of a second type and was identified as idle with respect to the semiconductor device and underwent separate modification of a circuit characteristic during fabrication to generate the second plurality of inhibited circuits from the one or more identified idle circuits of the second type.

Information as herein shown and described in detail is fully capable of attaining the above-described object of the disclosure. Any presently preferred embodiment(s) of is/are, thus, representative of the subject matter which is broadly contemplated by the present disclosure. The scope of the present disclosure fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims.

Moreover, no requirement exists for a device or method to address each and every problem sought to be resolved by the present disclosure, for such to be encompassed by the present claims. Furthermore, no element, component, or method step in the present disclosure is intended to be dedicated to the public regardless of whether the element, component, or method step is explicitly recited in the claims. However, that various changes and modifications in form, material, and fabrication material detail may be made, without departing from the spirit and scope of the disclosure as set forth in the appended claims, should be readily apparent to those of ordinary skill in the art. No claim herein is to be construed under the provisions of 35 U.S.C. §112, sixth paragraph, unless the element is expressly recited using the phrase "means for."

What is claimed is:

1. A method of reducing current leakage in a product variant of a semiconductor device, the method comprising:
  obtaining a design for fabricating the semiconductor device, the design comprising active circuits and unused circuits;
  identifying, from the unused circuits in the obtained design, one or more idle circuits, wherein each idle circuit is an unused circuit that is idle and not used in the product variant of the semiconductor device;
  fabricating the product variant of the semiconductor device based on the obtained design; and
  during fabrication of the product variant of the semiconductor device:
    selectively masking the product variant of the semiconductor device to expose each identified idle circuit; and
    modifying a characteristic of each exposed identified idle circuit to inhibit each exposed identified idle circuit and to reduce current leakage therefrom.

2. The method of claim 1, wherein identifying further comprises identifying, from the unused circuits in the obtained design, one or more idle circuits using design analysis on the product variant of the semiconductor device.

3. The method of claim 1, wherein identifying further comprises identifying, from the unused circuits in the obtained design, one or more idle circuits using function simulation on the product variant of the semiconductor device.

4. The method of claim 1, wherein identifying further comprises identifying, from the unused circuits in the obtained design, one or more idle circuits using hardware emulation on the product variant of the semiconductor device.

5. The method of claim 1, wherein identifying further comprises applying a subtractive idle circuit identification to identify, from the unused circuits in the obtained design, one or more idle circuits.

6. The method of claim 5, wherein applying the subtractive idle circuit identification comprises performing a static timing analysis on the active circuits and the unused circuits in the obtained design by using a predetermined set of timing constraints for the product variant of the semiconductor device.

7. The method of claim 1, wherein identifying further comprises:
analyzing static timing of all active circuits defined by the product variant of the semiconductor to generate a timing-constrained circuit list comprising one or more timing-constrained active circuits that have a timing-constrained path;
generating a non-timing constrained circuit list comprising one or more non-timing-constrained active circuits by omitting the one or more active circuits that have a timing constrained-path from a list of all active and unused circuits in the obtained design.

8. The method of claim 7, further comprising identifying the one or more idle circuits in the obtained design by omitting active circuits remaining in operation in the product variant of the semiconductor device from the non-timing constrained circuit list.

9. The method of claim 8, further comprising applying a scan-based test to the fabricated product variant, wherein the scan-based test is the same scan-based test applied to the semiconductor device.

10. The method of claim 7, wherein analyzing comprises analyzing static timing of all circuits defined by the product variant of the semiconductor device by using a set of timing constraints for the product variant, thereby providing static timing circuit data including data relating to each of the one or more timing-constrained active circuits.

11. The method of claim 9, further comprising:
reanalyzing static timing of all active circuits; and
performing, utilizing a processor, at least one of a circuit level simulation and a gate level timing simulation for confirming that the fabricated product variant of the semiconductor device is fully functional.

12. The method of claim 1, wherein identifying further comprises applying a marker layer for tagging the one or more idle circuits.

13. The method of claim 1, further comprising verifying a configuration of the product variant of the semiconductor device and preparing a new set of timing models for all types of unused circuits that are identified as idle circuits.

14. The method of claim 1, further comprising:
selecting an exception circuit from the one or more idle circuits; and
maintaining power to the exception circuit, providing the exception circuit with a minimized current leakage, and rendering the exception circuit operable at a minimized speed.

15. The method of claim 1, wherein the one or more idle circuits comprise a plurality of idle circuits each having the same device type, and wherein selectively masking the product variant of the semiconductor device comprises masking the plurality of idle circuits of the same device type with an idle circuit mask distinctive to the device type.

16. The method of claim 1, wherein the one or more idle circuits comprise a plurality of idle circuits, wherein the plurality of idle circuits comprise a first set of idle circuits of a first device type and a second set of idle circuits of a second device type, and wherein selectively masking comprises:
masking the first set of idle circuits with a first idle circuit mask; and
masking the second set of idle circuits with a second idle circuit mask; and
the first and second idle circuit masks being distinctive to the first and second device type, respectively.

17. The method of claim 1, wherein modifying further comprises:
modifying an electrical characteristic of each exposed idle circuit, resulting in each exposed idle circuit having modified electrical properties.

18. The method of claim 1, wherein modifying further comprises:
modifying a physical characteristic of each exposed idle circuit, resulting in each exposed idle circuit having modified electrical properties.

19. The method of claim 1, wherein modifying the characteristic of each exposed idle circuit comprises implanting a dopant.

20. The method of claim 18, wherein the dopant comprises at least one of: a voltage threshold (Vt) implant, a pocket implant, a lightly doped drain (LDD) implant, and a source and drain implant.

21. The method of claim 1, wherein modifying the characteristic of each exposed idle circuit comprises at least one of modifying a gate dielectric thickness or modifying a gate length.

* * * * *